US009138865B2

(12) United States Patent
Lund

(10) Patent No.: US 9,138,865 B2
(45) Date of Patent: Sep. 22, 2015

(54) METHOD TO IMPROVE EFFICIENCY OF PCD LEACHING

(71) Applicant: Smith International, Inc., Houston, TX (US)

(72) Inventor: Jeffrey Bruce Lund, Salt Lake City, UT (US)

(73) Assignee: Smith International, Inc., Houston, TX (US)

(*) Notice: Subject to any disclaimer, the term of this patent is extended or adjusted under 35 U.S.C. 154(b) by 0 days.

(21) Appl. No.: 14/132,100

(22) Filed: Dec. 18, 2013

(65) Prior Publication Data

US 2014/0165475 A1 Jun. 19, 2014

Related U.S. Application Data

(60) Provisional application No. 61/739,598, filed on Dec. 19, 2012.

(51) Int. Cl.
*B24D 3/02* (2006.01)
*B24D 3/10* (2006.01)

(52) U.S. Cl.
CPC ........................................ *B24D 3/10* (2013.01)

(58) Field of Classification Search
CPC ........ C09G 1/02; C09K 3/14; C04B 35/1115; C04B 14/32; H01L 21/3212
USPC .......................................................... 51/307
See application file for complete search history.

(56) References Cited

U.S. PATENT DOCUMENTS

| 2,941,241 A | 6/1960 | Strong |
| 2,947,611 A | 8/1960 | Bundy |
| 3,609,818 A | 10/1971 | Wentorf |
| 3,769,044 A * | 10/1973 | Horton .................. 106/38.3 |
| 4,104,344 A | 8/1978 | Pope et al. |
| 4,288,248 A | 9/1981 | Bovenkerk et al. |
| 4,289,503 A | 9/1981 | Corrigan |
| 4,333,986 A | 6/1982 | Tsuji et al. |
| 4,525,178 A | 6/1985 | Hall |
| 4,636,253 A | 1/1987 | Nakai et al. |

(Continued)

FOREIGN PATENT DOCUMENTS

| EP | 1497059 B1 | 7/2008 |
| GB | 2446512 A | 8/2008 |
| WO | 2011080685 A2 | 7/2011 |

OTHER PUBLICATIONS

A.A. Palant, V.A. Bryukvin, and A.M. Levin "Autoclave Processing of the Products of Catalytic Synthesis of Industrial Diamonds" Russian Metallurgy vol. 2008, No. 2, pp. 107-111 Pleiades Publishing Ltd., 2008.*

(Continued)

*Primary Examiner* — Pegah Parvini
*Assistant Examiner* — Alexandra Moore

(57) ABSTRACT

A method of treating polycrystalline diamond includes providing a leaching agent within a vessel, placing a polycrystalline diamond body within the vessel such that the polycrystalline diamond body contacts the leaching agent, and applying a vacuum pressure in the vessel at an interval, where the interval includes at least one cycle, each cycle having a duration measured from the time the vacuum pressure is applied to the time the vacuum pressure is removed, and a frequency at which the at least one cycle is conducted.

20 Claims, 2 Drawing Sheets

(56) References Cited

U.S. PATENT DOCUMENTS

| | | |
|---|---|---|
| 4,673,414 A | 6/1987 | Lavens et al. |
| 4,694,918 A | 9/1987 | Hall |
| 4,943,488 A | 7/1990 | Sung et al. |
| 4,954,139 A | 9/1990 | Cerutti |
| 5,370,195 A | 12/1994 | Keshavan et al. |
| 7,845,438 B1 | 12/2010 | Vail et al. |
| 8,864,858 B1 * | 10/2014 | Kidd et al. .................. 51/295 |
| 2003/0072669 A1 | 4/2003 | Butcher et al. |
| 2010/0294571 A1 * | 11/2010 | Belnap et al. ............... 175/434 |
| 2011/0030283 A1 | 2/2011 | Cariveau et al. |
| 2011/0252713 A1 | 10/2011 | Chakraborty et al. |
| 2012/0061149 A1 | 3/2012 | Liversage et al. |
| 2012/0227332 A1 | 9/2012 | Belnap et al. |
| 2012/0248663 A1 | 10/2012 | Hall et al. |

OTHER PUBLICATIONS

International Search Report and Written Opinion issued in PCT/US2013/076329 on Apr. 10, 2014; 9 pages.

"Leaching Autoclave Systems for the Investment Casting Industry", WSF Industries, Inc., No. 102-01, Jul. 9, 2012, 2 pages.

Wahlstrom et al., "Development of a quick leaching test for monolithic materials by using factorial design", Talanta, vol. 46 (3), Jul. 1998, pp. 365-374.

* cited by examiner

METHOD TO IMPROVE EFFICIENCY OF PCD LEACHING

CROSS-REFERENCE OF RELATED APPLICATIONS

Pursuant to 35 USC. §119, this application claims the benefit of U.S. Provisional Patent Application No. 61/739,598, filed on Dec. 19, 2012, which is herein incorporated by reference in its entirety.

BACKGROUND

Conventional polycrystalline diamond, ("PCD") may be formed by subjecting diamond particles in the presence of a suitable solvent metal catalyst material to processing conditions of high pressure/high temperature (HPHT), where the solvent metal catalyst promotes desired intercrystalline diamond-to-diamond bonding between the particles, thereby forming a PCD structure. The resulting PCD structure produces enhanced properties of wear resistance and hardness, making such PCD materials extremely useful in aggressive wear and cutting applications where high levels of wear resistance and hardness are desired. FIG. 1 illustrates a microstructure of conventionally formed PCD material 10 including a plurality of diamond grains 12 that are bonded to one another to form an intercrystalline diamond matrix first phase. The catalyst/binder material 14, e.g., cobalt, used to facilitate the diamond-to-diamond bonding that develops during the sintering process is dispersed within the interstitial regions formed between the diamond matrix first phase. The term "particle" refers to the powder employed prior to sintering a superabrasive material, while the term "grain" refers to discernable superabrasive regions subsequent to sintering, as known and as determined in the art.

The catalyst/hinder material used to facilitate diamond-to-diamond bonding can be provided generally in two ways. The catalyst/binder can be provided in the form of a raw material powder that is pre-mixed with the diamond grains or grit prior to sintering. In some cases, the catalyst/binder can be provided by infiltration into the diamond material (during high temperature/high pressure processing) from an underlying substrate material that the final PCD material is to be bonded to. After the catalyst/binder material has facilitated the diamond-to-diamond bonding, the catalyst/binder material is generally distributed throughout the diamond matrix within interstitial regions thrilled between the bonded diamond grains. Particularly, as shown in FIG. 1, the binder material 14 is not continuous throughout the microstructure in the conventional PCD material 10. Rather, the microstructure of the conventional PCD material 10 may have a uniform distribution of binder among the PCD grains 12. The microstructure may include both diamond grain/hinder interfaces 15 and diamond grain/diamond grain interfaces 16.

Solvent catalyst materials may facilitate diamond intercrystalline bonding and bonding of PCD layers to each other and to an underlying substrate. Solvent catalyst materials used for forming conventional PCD may include metals from Group VIII of the Periodic table, such as cobalt, non or nickel and/or mixtures or alloys thereof, with cobalt being the most common. Conventional PCD may include from 85 to 95% by volume diamond and a remaining amount of the solvent catalyst material. However, while higher metal content increases the toughness of the resulting PCD material, higher metal content also decreases the PCD material hardness, thus limiting the flexibility of being able to provide PCD tables having desired levels of both hardness and toughness. Additionally, when variables are selected to increase the hardness of the PCD material, brittleness also increases, thereby reducing the toughness of the PCD material.

Conventional PCD is stable at temperatures or up to 700-750° C. (1,292-1,382° F.), after which increases in temperature may result in permanent damage to and structural failure of PCD. For example, upon heating of PCD, the difference in the coefficient of thermal expansion of the binder material, which may be cobalt, as compared to diamond results in the cobalt and the diamond lattice expanding at different rates, which may cause cracks to form in the diamond lattice structure and result in deterioration of the PCD. High operating temperatures may also lead to back conversion of the diamond to graphite causing loss of microstructural integrity, strength loss, and rapid abrasive wear.

In order to overcome this problem, strong acids may be used to "leach" the cobalt from the diamond twice structure (either a thin volume or the entire body) to at least reduce the damage experienced from different expansion rates within a diamond-cobalt composite during heating and cooling. Briefly, a strong acid, such as nitric acid or combinations of several strong acids (such as nitric and hydrofluoric acid may be used to treat a PCD body, e.g., by submersing the body in the acid, thereby removing at least a portion of the catalyst from the PDC composite. By leaching out an amount of the catalyst, thermally stable polycrystalline ("TSP") diamond may be formed in certain embodiments, a select portion of a diamond composite is treated, in order to gain thermal stability with less effect on impact resistance. As used herein, the term thermally stable polycrystalline (TSP) includes both of the above (i.e., partial and complete treatment). Interstitial volumes remaining after leaching may be reduced by either furthering consolidation or by reinfiltrating the volume with a secondary material.

SUMMARY

This summary is provided to introduce a selection of concepts that are further described below in the detailed description. This summary is not intended to identify key or essential features of the claimed subject matter, nor is it intended to be used as art aid in limiting the scope of the claimed subject matter.

In one aspect, embodiments disclosed herein relate to a method of treating polycrystalline diamond that includes providing a leaching agent within a vessel, placing a polycrystalline diamond body within the vessel such that the polycrystalline diamond body contacts the leaching agent, and applying a vacuum pressure in the vessel, at an interval. The interval includes at least one cycle, each cycle having a duration measured from the time the vacuum pressure is applied to the time the vacuum pressure is removed, and a frequency at which the at least one cycle is conducted.

In another aspect, embodiments disclosed herein relate to a method of treating polycrystalline diamond that includes providing a leaching agent within to vessel, placing a polycrystalline diamond body within the vessel such that the polycrystalline diamond body contacts the leaching agent, and intermittently reducing the pressure of the vessel.

Other aspects and advantages of the claimed subject matter will be apparent from the following description and the appended claims.

BRIEF DESCRIPTION OF DRAWINGS

Embodiments of the present disclosure are described with reference to the following figures. The same numbers are used throughout the figures to reference like features and components.

DETAILED DESCRIPTION

Figure 1:
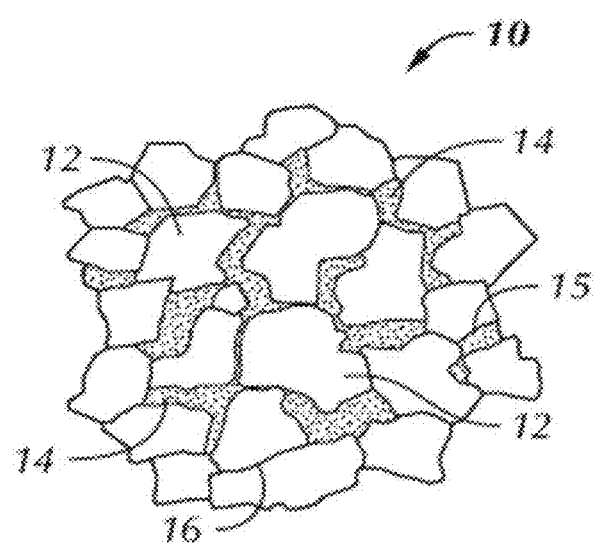
FIG. 1 shows the microstructure of conventionally formed polycrystalline diamond.

As used herein, the term "PCD" refers to polycrystalline diamond that has been formed, at high pressure/high temperature ("HPHT") conditions, through the use of a solvent metal catalyst, such as those included in Group VIII of the Periodic table. The term "thermally stable polycrystalline diamond" or "TSP," as used herein, refers to intercrystalline bonded diamond that includes a volume or region that has been rendered substantially free of the solvent like catalyst used to form PCD, or the solvent metal catalyst used to form PCD remains in the region of the diamond body but is otherwise reacted or rendered ineffective in its ability to adversely impact the bonded diamond at elevated temperatures as discussed above.

According to embodiments of the present disclosure, PCD may be formed by HPHT sintering of diamond grains in the presence of a suitable catalyst of binder material, such as cobalt and/or other transition metal from Group VIII of the Periodic Table, to achieve intercrystalline bonding between the diamond grains. Upon sintering the PCD body, the catalyst may remain within the interstitial regions formed between the bonded together diamond grains. The network of interstitial regions formed between the bonded together diamond grains may include interstitial regions that are directly or indirectly accessible to other interstitial regions formed within the PCD body, as well as interstitial regions that are inaccessible, which may be dispersed throughout PCD microstructure.

As used herein, the term "sintering" refers to the process of forming PCD using a HPHT process, examples of which may be found in U.S. Pat. Nos. 4,649,918, 3,370,195, and 4,525,178. Briefly, to form a sintered PCD body, an unsintered mass or volume of diamond grains may be placed within an enclosure of a reaction cell of a HPHT apparatus. Examples of suitable HPHT apparatuses are described in U.S. Pat. Nos. 2,947,611, 2,941,241, 3,609,818, 4,289,503, 4,673,414, and 4,954,139. A catalyst material, such as described, above, may be included with the unsintered mass of crystalline particles to promote intercrystalline diamond-to-diamond bonding. The catalyst material may be provided in the form of powder and mixed with the diamond grains, or may be infiltrated into the diamond grains during HPHT sintering, such as from an adjacent carbide substrate. The reaction cell is then placed under HPHT processing conditions sufficient to cause the intercrystalline bonding between the diamond particles.

HPHT processing may be carried out at elevated pressures of about 55-60 kbar, and at elevated temperatures of about: 1,400° C. (2,552° F.) or greater. However, a variety of temperatures and pressures may be used, depending on, for example, the type of catalyst material being used, the amount of diamond being bonded together, and the diamond grain size.

It should be noted that if too much additional non-diamond material is present in the powdered mass of crystalline particles, appreciable intercrystalline bonding is prevented during the sintering process. Such a sintered material where appreciable intercrystalline bonding has not occurred is not within the definition of PCD. Following such formation of intercrystalline bonding, a PCD body may be formed that has at least about 80 percent by volume diamond, with the remaining balance of the interstitial regions between the diamond grains occupied by the catalyst material. In other embodiments, the PCD body may comprise at least 85 percent by volume diamond, and in another embodiment at least 90 percent by volume diamond.

Diamond grains used for forming PCD may include any type of diamond particle, including natural or synthetic diamond powders having a wide range of particle sizes. For example, such diamond powders may have an average particle size in the range from submicrometer to about 100 micrometers. Further, the diamond powder used may include particles having a mono-modal or multi-modal distribution. According to some embodiments, PCD bodies may have an average grain size ranging from less than 1 micrometer. According to other embodiments, PCD bodies may have an average grain size ranging from 1 to 80 micrometers.

According to embodiments of the present disclosure, a method of treating a PCD body may include leaching the PCD body in a vacuum capable environment. For example, according to some embodiments, a leaching agent may be provided within a vessel, where the vessel is capable of having a vacuum applied therein. A PCD body, such as those described above, may be placed within the vessel such that the PCD body contacts the leaching agent. A vacuum pressure may then be applied within the vessel at a selected interval. According to other embodiments of the present disclosure, as leaching agent and as PCD body ma be placed within a vessel such that the PCD body contacts the leaching agent, and, while the PCD body is contacting the leaching agent, the pressure of the vessel may be intermittently reduced.

As used herein, the term "vacuum pressure" refers to pressures less than atmospheric pressure. Suitable pressure levels may include, for example, vacuum pressure levels ranging from about $1 \times 10^{-3}$ Torr (0.13 Pa) to about $1 \times 10^{-6}$ Torr (0.00013 Pa), and ranging $1 \times 10^{-4}$ Torr (0.013 Pa) to about $1 \times 10^{-5}$ Torr (0.0013 Pa) in another embodiment. However, the particular pressure may be dependent, for example, on the particular equipment used, the temperature selected, the amount (and type) of leaching agent present, and the total system volume. Further, while vacuum pressures may be used in some embodiments during the leaching process, other embodiments may include intermittently reducing the pressure of the leaching environment to a pressure below atmosphere (vacuum pressure) and/or to a pressure at or above atmosphere pressure. For example, in such embodiments, the leaching process may be conducted at a primary pressure. $P_1$, which may be intermittently reduced to a pressure lower than $P_1$, which may be below atmosphere, at atmosphere, or above atmosphere pressure.

Variable pressure conditions may be obtained, for example, by conducting a leaching process in a pressure vessel. Suitable pressure vessels include any type of closed environment or container in which a leaching process may be performed with application of reduced pressure levels. For example, a leaching process according to embodiments of the present disclosure may be conducted in an open container placed within a closed container, where the closed container may be pressurized or subjected to vacuum pressure, or directly in a closed container. According to some embodiments, a fixture or an assembly may be configured within the vessel or container to exert a vacuum onto or along one or more surfaces of the PCD body.

Figure 2:
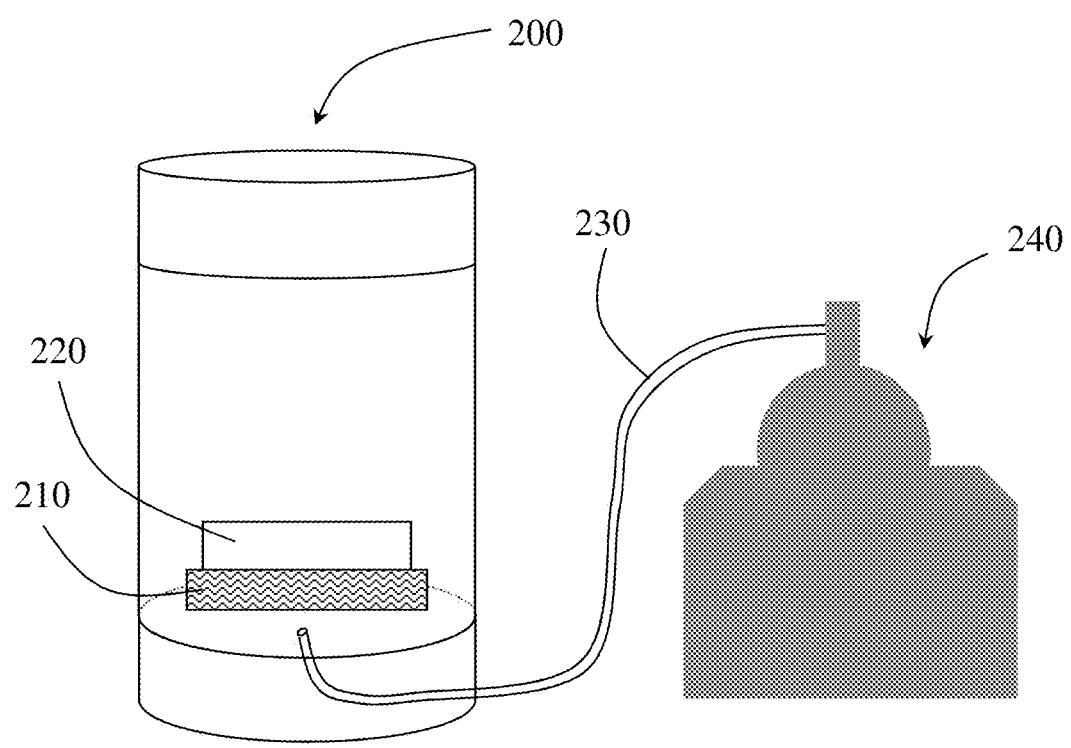
FIG. 2 shows a diagram of a pressure chamber and vacuum pump.

FIG. 2 shows an example of a suitable pressure vessel that may be used in accordance with embodiments of the present disclosure. As shown, a pressure vessel 200 may have a heater 210 and a leaching tray 220 disposed therein. A vacuum hose 230 may run from within the pressure vessel 200 to a vacuum pump 240 in order to create vacuum pressure within the sealed pressure vessel 200. According to embodiments of the present disclosure, a PCD body (not shown) may be placed within or on the leaching tray 220 of the pressure vessel 200, and the pressure vessel 200 may be sealed. Vacuum pressure may be applied to the pressure vessel 200 at a selected interval using the vacuum pump 240. The heater 210 may be used to heat the leaching agent disposed in or on the leaching tray 220 at selected times during the leaching process, for example, during the entire leaching process or during a portion of the leaching process, such as when vacuum pressure is applied or when the vacuum pressure is removed.

The leaching process in methods according to the present disclosure may include contacting a PCD body with a leaching agent. A PCD body may be entirely submersed within a bath of the leaching, agent, or a selected portion of a PCD body may be placed within the leaching agent. For example, less than 20 percent, up to 30 percent, up to 40 percent, or up to 50 percent of the PCD body may be immersed in a leaching agent. In other embodiments, greater than 50 percent or greater than 75 percent of a PCD body may be immersed in a leaching agent. In some embodiments, the entire PCD body may be submersed in a leaching agent. Leaching agents may include a weak acid, a strong acid, or mixtures of different acids. In other embodiments, the leaching agent may be a caustic material, such as NaOH or KOH. Suitable acids may include, for example, nitric acid, hydrofluoric acid, hydrochloric acid, sulfuric acid, phosphoric acid, or perchloric acid, or combinations of these acids. Further, other acidic and basic leaching agents may be used as desired. The molarity of the leaching agent may be adjusted depending on the time desired to leach, concerns about hazards and handling issues, for example.

While a leaching agent is contacting a PCD body, a reduced pressure, such as a vacuum pressure, may be applied within the vessel at a selected interval, where the interval includes at least one cycle of applying the vacuum, or at least 2 cycles in another embodiment. Each cycle has a duration measured from the time the reduced pressure is applied to the time the reduced pressure is removed and a frequency at which the cycle is conducted. For example, according to methods of the present disclosure, a PCD body may be at least: partially surrounded b a leaching agent within a vacuum-capable vessel. While the PCD body contacts the leaching agent, a first cycle of vacuum pressure may be applied within the vessel for a duration of time, where the duration is measured from the time the vacuum pressure is applied to the time the vacuum pressure is removed. When the vacuum pressure is removed, the pressure of the vessel may be increased to about atmosphere. In some embodiments, when the vacuum pressure is removed, the pressure of the vessel may be increased to a value that is less than atmosphere but greater than the vacuum pressure. In other embodiments, when the vacuum pressure is removed, the pressure of the vessel may be increased to a value that is greater than atmosphere. In yet other embodiments, when the vacuum pressure is removed, the pressure of the vessel may be increased to multiple pressure values that are higher than the vacuum pressure.

According to embodiments of the present disclosure, the duration may be less than 5 minutes. According to other embodiments, the duration may be at least 5 minutes. For example, according to some embodiments, the duration may range between 10 and 15 minutes. In yet other embodiments, the duration may be greater than 15 minutes. In yet other embodiments, the duration may be greater than 1 hour. Further, the duration of each cycle may be the same, or the duration of two or more cycles may be different. For example, in embodiments having different cycle durations, each cycle may progressively last longer, each cycle may progressively last shorter, the cycles may increase and decrease in a selected pattern, or one or more cycles may have an irregular variation in duration when compared with the remaining cycle(s).

A first cycle of a reduced pressure or vacuum interval may be delayed a selected initiation period of time before applying the reduced pressure to the PCD body. During the initiation period, the leaching agent may begin to infiltrate through the interstitial regions of the PCD and remove the catalyst material. For example, according to embodiments of the present disclosure, a PCD body may contact the leaching agent at least 30 seconds prior to applying a first vacuum cycle. In some embodiments, the initiation period may be greater than 5 minutes before the first cycle of the vacuum interval begins. In yet other embodiments, a PCD body may contact the leaching agent in the initiation period for greater than 1 hour prior to applying a vacuum in a first cycle. In yet other embodiments, a PCD body may contact the leaching agent in the initiation period for greater than 1 day, such as between 1 and 5 days, prior to applying a vacuum in a first cycle.

Upon completion of the first cycle, an intermediary period of time may pass before a subsequent cycle, if any, is conducted. Two or more cycles, including a first cycle and one or more subsequent cycles, may be conducted at a regular interval (i.e., the same intermediary time between each cycle) or an irregular interval (i.e., different intermediary tunes between cycles). Further, the frequency of the interval (i.e., rate of conducting the cycles) may be determined by the length of the intermediary period of time between cycles. For example, in methods having a vacuum pressure applied at a regular interval, equal intermediary periods of time occur between each cycle, where the intermediary period is measured from the time the vacuum pressure is removed from one cycle to the time the vacuum pressure is applied in the subsequent cycle. In methods having a vacuum pressure applied at an irregular interval, unequal intermediary times may occur between cycles. In other embodiments, the frequency of the interval may be determined by the number of cycles conducted within the total leaching time, where the total leaching time is measured from the time the PCD body contacts the leaching agent to the time the PCD body is removed from the leaching agent. Thus, the total leaching time may include the initiation period, the duration of each cycle, all intermediary periods between cycles, and any amount of time the PCD body remains in the leaching agent after the last cycle of a method is completed. For example, in methods having 5 cycles of a vacuum pressure applied at a regular interval during a total leaching time of 5 days, the frequency may be equal to conducting one cycle per day. However, other frequencies may be used in methods of the present disclosure. For example, methods of the present disclosure may include applying a vacuum during leaching at an interval having a frequency of more than one vacuum cycle per day. In other embodiments, a vacuum may be applied during leaching at an interval having a frequency of less than one cycle per day. In yet other embodiments, a vacuum may be applied during leaching at an interval having a frequency of more than once per day, such as once per hour.

Further, methods of the present disclosure may include various combinations of an initiation period length, number of cycles, duration of cycles, cycle frequency, and intermediary period length(s), such as various combinations of the examples of each provided herein. For example, in some embodiments, a vacuum pressure may be applied at an interval including at least one cycle having a duration ranging between 10 and 15 minutes and a frequency of up to one cycle per day. In some embodiments, a vacuum pressure may be applied at an interval including at least one cycle having a duration of greater than 15 minutes and a frequency of up to one cycle per day. In yet other embodiments, a vacuum pressure may be applied at an interval including two or more cycles having one or more duration values and a frequency ranging from once every 2-3 days up to 10 to 24 times per day.

Methods of the present disclosure may be conducted at temperatures ranging up to about 55° C. (131° F.), and between 40° C. (104° F.) and 50° C. (122° F.) in some embodiments. The temperature of the leaching agent may be substantially the same throughout at least the majority of the total leaching time, or the temperature may vary throughout the total leaching rum. For example, according to embodiments of the present disclosure, the temperature of the leaching agent may remain substantially constant and less than 55° C. (131° F.) throughout the total leaching time. In other embodiments, the temperature of the leaching agent may decrease during vacuum cycles and increase during the intermediary periods. For example, in some embodiments, the temperature of the leaching agent during the step of applying the vacuum pressure may range from any lower limit of 36° C., 39° C., 42° C. or 45° C. (98.6° F., 102.2° F., 107.6° F., 113° F.) to any upper limit of 39° C., 42° C., 45° C. or 48° C. (102.2° F., 107.6° F., 113° F., 1184° F.), while the temperature of the leaching agent during the intermediary periods may be higher than the temperature during the vacuum cycles and may range from any lower limit of 38° C., 41° C., 44° C. or 47° C. (100.4° F., 105.8° F., 111.2° F., 116.6° F.) to any upper limit of 41° C., 44° C., 47° C. or 50° C. (105.8° F., 111.2° F., 116.6° F., 122° F.).

Once the leaching method is completed and the PCD body is removed from the leaching agent, the resulting material microstructure of the leached portion of the diamond body includes a first matrix phase of the bonded-together diamond grains and a second phase of a plurality of empty interstitial regions dispersed within the matrix phase. In other words, at the end of the leaching process, the treated interstitial regions are substantially empty so that the second phase may be described as a plurality of voids or empty regions dispersed throughout the diamond-bonded matrix phase. Thus, the leached portion of the diamond body may be substantially free of the catalyst material used to initially form or sinter the diamond body, and may be referred to as thermally stable polycrystalline diamond ("TSP").

As used herein, "substantially empty" means that in some embodiments, a quantity of catalyst material may remain in the PCD material microstructure after the PCD body has been subjected to a leaching treatment, which may vary, for example, on factors such as the composition of the PCD body, e.g., the diamond density of the material, the diamond grain size, and/or the diamond body thickness, and the treatment conditions, e.g., the leaching agents that are used and/or the treatment time. For example, in some embodiments, a leached PCD body may include up to about 1 to 2 percent by weight of residual catalyst material. Residual solvent catalysts may be in many instances trapped as inclusions within the microstructure, within regions of neck growth between diamond crystals, for example, within interstitial regions that are not directly or indirectly accessible to other interstitial regions, such as described above. However, such residual catalyst material may not significantly affect the thermal stability of the resulting TSP body.

Further, improved leaching rates and leaching depths may be achieved by using leaching methods of the present disclosure when compared with conventional leaching techniques. For example, it has been shown that the leaching rate of some conventional leaching methods, such as those including immersing a diamond body in a heated acid mixture, declines after the leaching depth exceeds approximately 100 microns from a surface of the PCD body contacting the leaching agent. It is theorized that the limited leaching depth of conventional leaching methods has been due to the inability to deliver fresh leaching agent through the porosity of the PCD body to the porosity that remains filled with catalyst. For example, PCD bodies formed at higher pressures and with finer grain size materials, such as some of the PCD bodies described herein, may have less accessible interstitial regions to conventionally provided leaching agents, and the conventionally provided leaching agent may become trapped along with interstitially bound catalyst material.

However, by using methods of the present disclosure to treat and remove catalyst material from a PCD body, a greater amount of catalyst material may be removed from interstitial regions to achieve an improved leaching depth. Particularly, during the course of leaching in methods of the present disclosure, a vacuum may be applied at a selected interval. During each vacuum cycle, gases and other bi-products formed by the leaching agent that may be present at the leaching front, such as acid fumes, may be removed. Once the vacuum cycle is completed. (i.e., once the vacuum pressure is removed), fresh leaching agent may flow into the evacuated space at the leaching front, thereby accelerating the leaching process.

According to embodiments of the present disclosure, leached TSP bodies may be attached (or reattached) to a substrate after completing the leaching process by methods known in the art, to facilitate attachment to a bit, cutting tool, or other end use application or device. For example, a TSP body formed according to methods of the present disclosure may be attached to a substrate to form a TSP cutting element for use on a down hole tool. Down hole tools may include bits having a body, a plurality of blades extending from the body, and at least one TSP cutting element disposed on the plurality of blades. The at least one TSP cutting element is disposed on the blades such that a working surface, i.e., a surface that contacts and cuts the formation being drilled, is positioned at a leading face of the blade and faces in the direction of the drill's rotation. The TSP cutting element may include a TSP body made according to methods disclosed herein, having a plurality of bonded together diamond grains forming a matrix phase and a plurality of substantially empty interstitial regions interposed between the bonded together diamond grains.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A method of treating polycrystalline diamond, comprising:
   providing a leaching agent within a vessel;
   placing a polycrystalline diamond body within the vessel such that the polycrystalline diamond body contacts the leaching agent; and
   applying a vacuum pressure in the vessel at an interval, the interval comprising:
      at least one cycle, each cycle having a duration measured from the time the vacuum pressure is applied to the time the vacuum pressure is removed; and
      a frequency at which the at least one cycle is conducted, wherein a temperature of the leaching agent during an intermediary period of time that passes before a subsequent cycle is applied, is higher than the temperature of the leaching agent during the vacuum cycle.

2. The method of claim 1, wherein the duration is at least 5 minutes.

3. The method of claim 1, wherein the duration ranges between 10 and 15 minutes.

4. The method of claim 3, wherein the frequency ranges up to once per day.

5. The method of claim 1, wherein the frequency is greater than once per day.

6. The method of claim 1, wherein the polycrystalline diamond body contacts the leaching agent at least 30 seconds prior to applying the first cycle.

7. The method of claim 1, wherein the leaching agent comprises an acid solution.

8. The method of claim 1, wherein the polycrystalline diamond body comprises an average grain size of less than 1 micrometer.

9. The method of claim 1, wherein prior to contacting the polycrystalline diamond body with the leaching agent, the polycrystalline diamond body comprises at least one catalyst material selected from the group consisting of transition metals from Group VIII of the Periodic Table.

10. The method of claim 1, wherein the polycrystalline diamond body comprises at least 90 percent by volume diamond.

11. The method of claim 1, wherein the temperature during applying the vacuum pressure is up to 55° C.

12. The method of claim 11, wherein the temperature during applying the vacuum pressure ranges between 40° C. and 50° C.

13. The method of claim 1, wherein the vacuum pressure ranges from about $1\times10^{-3}$ Torr to about $1\times10^{-6}$ Torr.

14. The method of claim 1, wherein the vacuum pressure is applied at a regular interval.

15. The method of claim 1, wherein the vacuum pressure is applied at an irregular interval.

16. The method of claim 1, wherein two or more cycles have a different duration.

17. The method of claim 1, wherein the duration of each cycle is the same.

18. A method of treating polycrystalline diamond, comprising:
provFiding a leaching agent within a vessel;
placing a polycrystalline diamond body within the vessel such that the polycrystalline diamond body contacts the leaching agent; and
intermittently reducing the pressure of the vessel,
wherein a temperature of the leaching agent during an intermediary period of time that passes before a subsequent cycle of reducing the pressure is applied, is higher than the temperature of the leaching agent during reducing the pressure.

19. The method of claim 18, wherein prior to contacting the polycrystalline diamond body with the leaching agent, the polycrystalline diamond body comprises at least one catalyst material selected from the group consisting of transition metals from Group VIII of the Periodic Table.

20. The method of claim 18, wherein the pressure is reduced to between about $1\times10^{-3}$ Torr and about $1\times10^{-6}$ Torr.

* * * * *